United States Patent [19]
Greer et al.

[11] 4,117,323
[45] Sep. 26, 1978

[54] ELECTRON MICROSCOPES

[75] Inventors: Raymond Thomas Greer; Bradley Harold Vale; David Michael Martin, all of Ames, Iowa

[73] Assignee: Iowa State University Research Foundation, Ames, Iowa

[21] Appl. No.: 774,869

[22] Filed: Mar. 7, 1977

[51] Int. Cl.² .......................................... G01M 23/00
[52] U.S. Cl. ................................... 250/311; 250/399
[58] Field of Search ............................ 250/311, 399

[56] References Cited

U.S. PATENT DOCUMENTS

| 3,418,473 | 12/1968 | Blue | 250/370 |
| 3,558,885 | 1/1971 | Fleming | 250/399 |
| 3,812,288 | 5/1974 | Walsh et al. | 250/311 |
| 3,864,722 | 2/1975 | Carnes | 250/370 |
| 4,048,502 | 9/1977 | Gudden | 250/370 |

OTHER PUBLICATIONS

"Scanning Electron Microscope," Japan Electronic Engineering, Nov. 1970, No. 48, pp. 66-70.

Primary Examiner—Harold A. Dixon
Attorney, Agent, or Firm—Dawson, Tilton

[57] ABSTRACT

Cathodoluminescence is detected either in the transmitted or emitted mode in a scanning electron microscope by means of a photodiode mounted to the specimen base in the sample stage of the system, thereby permitting a broader spectral response. Preferably, the photodiode is mounted together with its feedback amplifier resistor and capacitor in a metallic housing secured to the sample base beneath the sample (in the transmitted mode) or above and to the side of the sample (in the emitted mode). The response signal is thus coupled from the vacuum chamber in electrical, not optical form.

7 Claims, 6 Drawing Figures

ELECTRON MICROSCOPES

BACKGROUND AND SUMMARY

The present invention relates to electron microscopes. It has utility both in scanning electron microscopes wherein a beam is scanned through a raster across a sample, as well as such microscopes which are used for point-to-point analysis. The present invention has particular utility in scanning electron microscopes used in the cathodoluminescent mode for biological applications. In the past, cathodoluminescent studies have been impeded by the need for stains used on the samples which are not damaged by the incident beam. The low levels of cathodoluminescent emission normally associated with biological samples has made it difficult to detect the resulting cathodoluminescence due to limitations on the capabilities of existing systems.

Typically, in current electron microscopes, mirrors are used adjacent the sample to collect the optical luminescence emitted by the sample. The mirrors collect the light and focus it to the input of an optical bundle or light pipe which transmits the light from within the vacuum system to a photomultiplier tube located outside the vacuum system. Although attempts have been made to design mirrors capable of collecting luminescence over a region extending $2\pi$ steradians, in practice, systems have achieved somewhat less than that which is theoretically possible. Further, whatever light is collected reduces in intensity as it is transmitted through the light pipe. Light pipes are known to attenuate light intensity by as much as 60 percent per foot of length of the light pipe.

The present invention is directed to an electron microscope which uses a photodiode for sensing optical luminescence. Although the illustrated embodiment includes an electron microscope with a scanning beam, persons skilled in the art will readily appreciated it that the invention may be used for point-to-point analysis. Further, the term "electron microscope" is intended to be broad enough to include both beams of electrons and beams of other charged particles or ions.

The photodiode preferably is of the PIN type (that is, a PIN diode structure, as is known in the art, has a thin P-type diffusion in the front and an N-type diffusion into the back of the wafer of a very high resistivity silicon. The high resistivity material between the P-type and N-type diffusion is called the intrinsic region or I-layer. This optimizes both short- and long-wavelength response at low reverse bias. These diodes have a better spectral response than photomultiplier tubes, thereby extending the useful sensing range.

In the illustrated embodiment, the sensing photodiode and its feedback resistor and capacitor, which are associated with a feedback amplifier matched to the photodiode by the manufacturer, are mounted in a metallic cylindrical housing which is secured to the sample base beneath the sample in the transmitted mode or above and to the side of the sample in the emitted mode. Thus, the photodiode itself senses the optical luminescence directly adjacent the sample. This eliminates complex and expensive collection subsystems, and it further has an advantage in that the optical signal is converted to an electrical signal immediately adjacent the sample. Hence, an electrical signal, rather than an optical signal can be transmitted through the vacuum housing to the display circuitry, thereby obviating the problem discussed above of attenuation when an optical system is transmitted through a light pipe.

Other features and advantages of the present invention will be apparent to persons skilled in the art from the following detailed description of a preferred embodiment accompanied by the attached drawing wherein identical reference numerals will refer to like parts in the various views.

THE DRAWING

DETAILED DESCRIPTION

Figure 1:
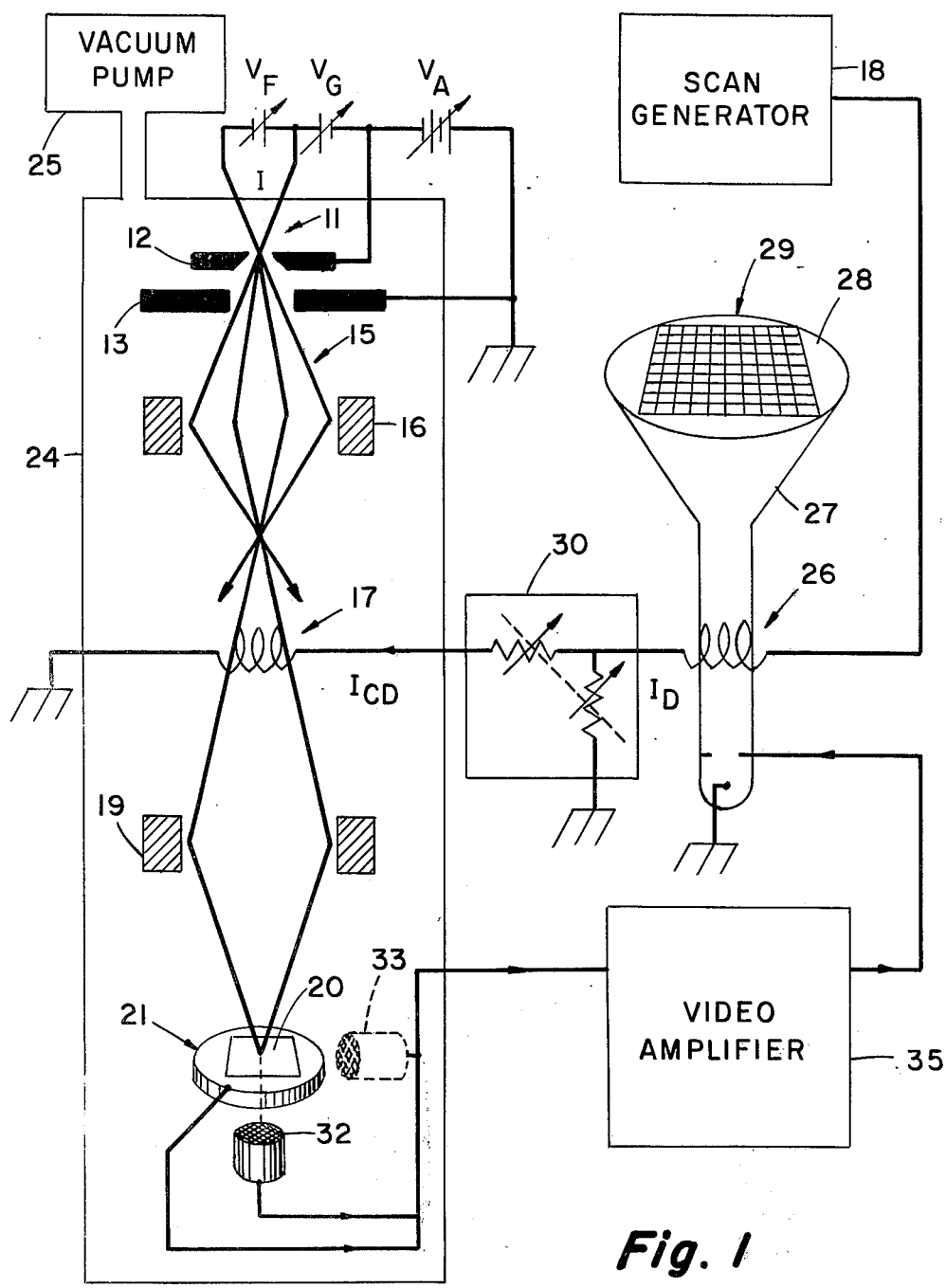
FIG. 1 is a schematic diagram, partly in functional block form, of a scanning electron microscope incorporating the present invention.

Referring first to FIG. 1, a scanning electron microscope includes a cathode 11 for generating electrons which are controlled by a grid 12 and accelerated by an anode 13. A first power supply $V_F$ is used to heat the cathode. A second power supply $V_G$ energizes the grid 12; and the third power supply $V_A$ supplies the accelerating potential.

An electron beam, referred to as the "primary beam" is generally designated by reference numeral 15. It has a tendency to diverge after acceleration; and a magnetic coil 16, sometimes referred to as a magnetic "lens" or condenser, is used to focus the beam 15. The beam passes through a deflection yoke 17 which is energized by a scan generator 18 used to generate the signals for moving the beam in a predetermined raster. After passing through the deflection yoke 17, the beam is focused a second time by means of a magnetic lens 19 onto a specimen 20 which is supported on a sample base 21.

The elements thus far described, except for the power supplies, are located within a vacuum chamber defined by a housing 24. A desired level of vacuum is maintained within the housing 24 by means of a vacuum pump 25.

The signals from the scan generator 18 are also coupled to the deflection coils generally designated 26 of a conventional kinescope 27 having a faceplate panel 28 on which an image 29 is displayed. Although the deflection yokes 17, 26 are illustrated as single coils, there are, in fact, separate X and Y deflection coils. The signals from the deflection yoke 26 are coupled through a gain adjusting network 30 to the deflection yokes 17 in the microscope.

Figure 5:
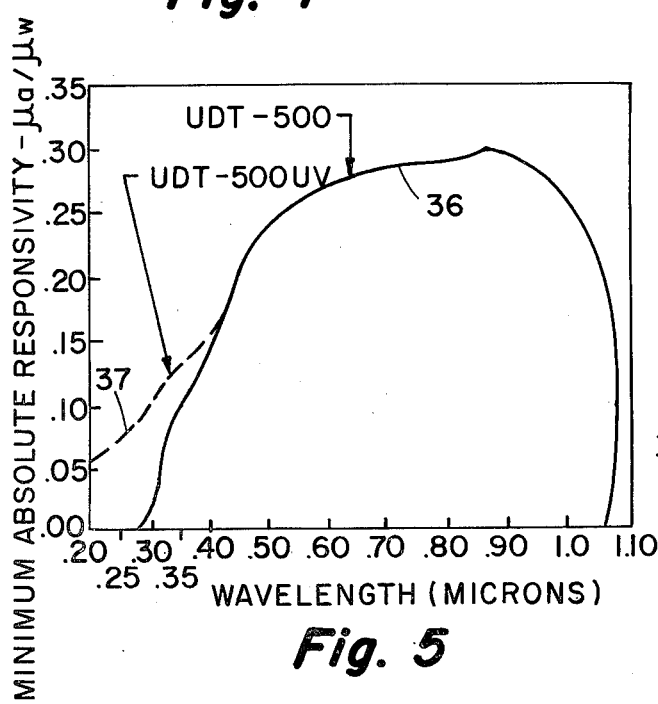
FIG. 5 is a graph illustrating the spectral response of a photodiode which might be used in the present invention.

Optical luminescence is detected by a first photodiode detector 32 when the system is operating in the transmitted mode, and a second photodetector (shown in phantom at 33) when the system is operated in the emitted mode. The detector 32 is positioned beneath the sample 20 to sense luminescence transmitted through the sample; and the photodetector 33, when it is used, is positioned to the side of and above the sample 20. The detectors 32 and 33 may be identical. Each of the detectors, as will be more fully discussed below, includes a matched first-stage amplifier, the output signal of which is transmitted through the housing 24 to a videoamplifier 35 which is coupled to the modulating grid of the kinescope 27. The electron beam of the kinescope 27 thus has an intensity which is representative of the optical luminescence sensed by a detector. Since the beam of the kinescope 27 is scanned in a raster corresponding to the raster in which the electron beam 15 scans the sample 20 there is thus generated an image 29 on the faceplate 28 of the kinescope 27 which corresponds in spatial relationship to the portion of the sample being scanned, and having an intensity representative of the amount of optical luminescence that is sensed by the detector means. The detector means includes a sensitive photodiode, such as that commercially available under the designation UDT-500 or UDT-500uv photodiode manufactured by United Detector Technology of Santa Monica, Calif. The "uv" designation indicates that the spectral response extends into the ultraviolet region. Referring to FIG. 5, reference numeral 36 designates a solid graph illustrating the spectral response of the UDT-500 photodiode which may be extended according to the dashed line 37 into the ultraviolet range by the UDT-500uv photodiode. In FIG. 5, the abscissa is the wavelength in microns, and the ordinate indicates the minimum response in microamps of the detector.

These diodes have a 1 cm.$^2$ active area and exhibit maximum sensitivity in the range of 3,000 to 11,000 Å for the UDT-500. If desired, spectral regions for analysis of optical fluorescence can be chosen, for example, by the use of thin film transmission interference filters. Similarly, cathodoluminescence intensity distributions can be measured by using neutral density filters. Such filters would be positioned between the specimen and the detector within the microscope, and they would permit correlation studies of intensity of light emission, wavelength (color of emission), and elemental analysis on a point-by-point basis, or recorded from a kinescope screen as a conventional two-dimensional display.

Figure 6:
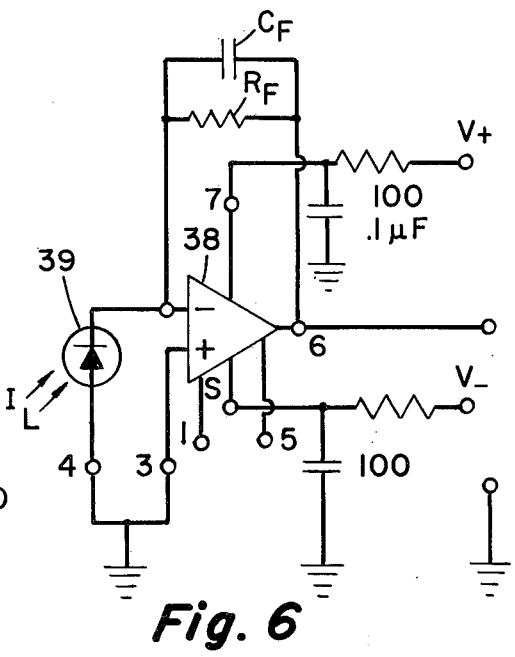
FIG. 6 is a circuit schematic diagram showing a photodiode and its associated feedback amplifier, resistor and capacitor comprising a first stage of amplification.

Turning now to FIG. 6, there is shown a low noise FET operational amplifier 38 which receives the output signal from a photodiode schematically illustrated at 39, on which the optical luminescence impinges. The other circuitry, including resistor $R_F$ and capacitor $C_F$ are used for frequency compensation; and the remainder of the illustrated circuitry is used for power supply decoupling of the amplifier 38. The associated circuitry stabilizes the amplifier and decreases the noise by establishing a cutoff frequency for the high frequency response at $1/(2\pi R_F C_F)$. The values of resistor $R_F$ and $C_F$ are chosen to maximize output signal, minimize noise, and produce an adequate rise time. $R_F$ is chosen to give an equivalent 10-90% rise in 0.1mm of scan across the cathode ray tube (this corresponds to somewhat better than the resolution capability of the human eye). The rise time necessary for a 100 second scan consisting of 1000 lines is calculated as:

$$\frac{100 \text{sec}}{1000 \text{ lines}} \times \frac{1 \text{ line}}{10 \text{cm}} \times \frac{100 \text{cm}}{1 \text{m}} \times \frac{0.1 \text{mm}}{\text{resolution distance}} \times$$

$$\frac{1 \text{m}}{100 \text{mm}} = \frac{100 \text{ microseconds}}{\text{resolution distance}}$$

Thus, the signal rise must be from 10 to 90% in 100 microseconds (a doubled scan speed of 50 sec/frame would give the same rise in 0.2mm). However, the choice of $R_F$ also depends on other considerations, such as noise cutoff.

A bandpass of 10 kHz is chosen to eliminate high frequency noise. The high frequency response is rolled off at $$\frac{1}{2\pi R_F C_F} \cdot \text{Thus, } 10^4 \text{Hz} = \frac{1}{2\pi 10^4 \text{sec}} \text{ and } R_F C_F = 16 \times 10^{-6} \text{ sec.}$$

A value of 32 microseconds given for 100K ohms may be considered the limiting case, with the actual rise time increased by the contribution of $C_F$.

A further restriction is imposed on the value of $R_F$. Broadband noise is specified at −0.2mV. Consequently, the noise for the cathodoluminescence system should be less. To produce a signal to noise ratio of 5:1 using $R_F$ = 100K ohms, the output must be 1.0mV which occurs at the incident energy values of approximately $5 \times 10^{-8}$ watts. Thus, the maximum sensitivity is on the order of $10^{-8}$ watts per square centimeter at a wavelength of 0.7 microns.

Figure 4:
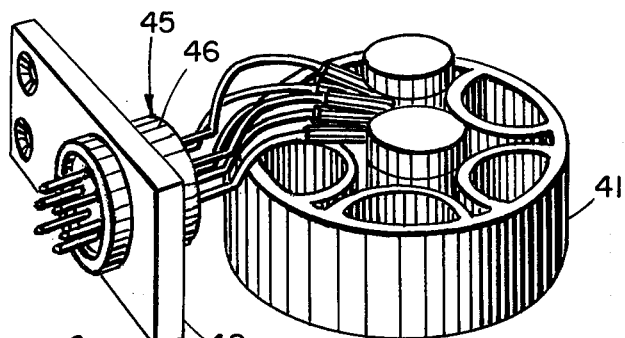
FIG. 4 is a perspective view of the bottom of the housing for the photodiode of FIGS. 2 and 3.

Referring now to FIG. 4, the photodiode 39 and associated circuitry shown in FIG. 6 are mounted in a metal cylinder or sleeve 41 (shown upside down in FIG. 4). The sleeve 41 is then mounted to a conventional scanning electron microscope specimen stage or base 42 in the form of a square metal block provided with diagonally cut ways, 43, 44. Electrical wiring from the circuitry in the cylinder 41, including power supply leads is grounded to a connector generally designated 45 and including a plug 46 and a socket 47. The plug 46 is mounted to a metal plate 48 which is attached by means of screws to the base 42.

Conventional X and Y-positioning mechanisms generally designated respectively 50 and 51 are incorporated into the specimen stage for positioning the base 42 as desired.

On top of the cylindrical housing 41 is the photodiode assembly 52, including an outer ring 53 which defines a central window in which is mounted the photodiode 54.

The output of the diode and its amplifier is coupled through the connector 45 and a cable 56 (which also couples the power supply to the circuitry) through a vacuum-tight seal in the housing 24. The video amplifier 35 comprises a second stage of amplification.

If it is desired to operate the system in the transmitted mode, the sample is secured to the ring 53 above the active area of the photodiode 54. It will thus be observed that the active area of the photodiode 54 is immediately adjacent the sample, but on the side opposite the incident beam.

Figure 3:
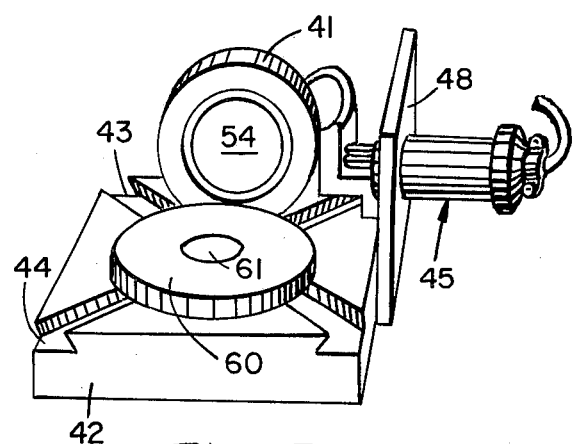
FIG. 3 is an upper perspective view of the sample base of an electron microscope illustrating the mounting of the photodiode in the emitted mode.

If it is desired to operate the system in the emitted mode, as seen in FIG. 3, the base 54 is provided with a disc-shaped support member 60 on which the sample 61 is placed. In this case, the photodiode assembly remains the same, but it is mounted above and to the side of the support 60. The position of the mounting plate 48 and connector 45 remains the same. In this position, the photodiode is able to detect emitted optical luminescence.

Operation

Figure 2:
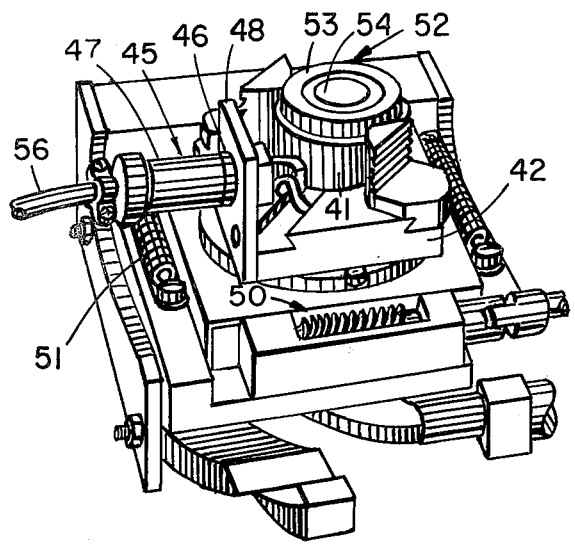
FIG. 2 is an upper perspective view of a sample base of a scanning electron microscope constructed according to the present invention illustrating the mounting of the photodiode in the transmitted mode.

For operation in the transmitted mode (FIG. 2), samples (individual grains or thin sections) are mounted in TEM grids, on Formvar-coated TEM grids, or on glass slides or cover slips. If the ultraviolet region of the spectrum is being investigated, Pyrex slides will not be satisfactory and UV-transparent glass blanks must be used. High purity glass flats are commonly available which do not luminesce under electron bombardment, and for which optical fluorescence transmission losses are negligible through spectral regions of potential interest in the ultraviolet, visible, and infrared. Also, narrow band transmission interference filters can be interposed between the specimen and the photodiode 54.

The electron beam excites the fluorescence which passes through the thin samples and is detected below the sample. Intensity variations for a sample are dependent, for example, on sample thickness, depth of electron penetration into the specimen, specimen transparency, trace element distribution, as well as the quality and homogeneity of the specimen (phase distribution, dislocation density, etc.). Depending on the nature of the transmission response that is being investigated, specimens of the order of a few microns in thickness will be satisfactory.

In the emitted mode of FIG. 3 where the detector is facing the specimen surface upon which the electrons are incident, larger grains or thin sections can be conveniently utilized. In optical microscope work, individual crystals are generally of the order of 125 to 149 micrometers in diameter (100 to 200 mesh), and thus specimen mounts of this type can also be easily studied in CL. Also in optical microscopy, many mineral thin sections are prepared of a thickness of 30 micrometers mounted and attached to a glass slide about 1.5 mm. thick. The balsam holding the coverslip and the glass slide to the mineral section can be heated to allow removal of the thin coverslip leaving the glass slide and mineral mount. The upper surface of the thin section can be cleaned with xylol, followed by a kerosene wash, to remove traces of the balsam from the prepared thin section. The SEM beam then interacts with this surface to generate the CL, providing a type of CL petrographic examination of opaque minerals (or transparent minerals in transmission mode) which can be directly correlated with the optical microscope work.

Ion etched or electrochemically thinned materials can be prepared for transmission fluorescence work as well.

When coupled with the point-by-point X-ray energy analysis technique and CL information, multivariate statistical analytical techniques can be utilized to process optical fluorescence and microchemical data. From this information it is possible to determine fluorescence spectra variations from sample to sample and to correlate the intensity and wavelength of optical fluorescence with chemical composition.

Gain and level for the detection system are controlled through the amplifier in the console. The signal from the amplifier is fed into cathode ray tubes appropriate for viewing or for photgraphic purposes.

Having thus described in detail preferred embodiments of the invention, persons skilled in the art will be able to modify certain of the structure which has been illustrated and to substitute equivalent elements for those disclosed while continuing to practice the principle of the invention; and it is, therefore, intended that all such modifications and substitutions be covered as they are embraced within the spirit and scope of the appended claims.

We claim:

1. In a beam microscope including means for generating and directing a beam toward a sample, a housing for said generating means and said sample; means for generating a vacuum in said housing; apparatus comprising: detector means including a semiconductor photodiode for sensing optical luminescence from said sample in response to the impingement thereon by said beam and for converting said sensed luminescence to a representative electrical signal; means for mounting said detector means in said vacuum housing immediately adjacent said sample whereby said luminescence falls directly on said photodiode; low-noise amplifier means in circuit with said photodiode for amplifying the signal generated by said photodiode in response to incident optical luminescence; means for mounting said amplifier immediately adjacent said photodiode within said vacuum housing; conductor means coupled to the output of said amplifier means for coupling said output electrical signal through said housing; and display means coupled to said conductor for generating a visual image responsive to said electrical signal.

2. The apparatus of claim 1 wherein said amplifier means includes a feedback capacitor and resistor connected between its input and output terminals, said capacitor and resistor amplifying the signal from said photodiode and establishing a high frequency cutoff to minimize noise and producing sufficient rise time in said amplifier to respond to said luminescence.

3. The apparatus of claim 2 wherein said mounting means includes a metal cylinder for carrying said detector means, said sample being mounted directly above said photodiode on said cylinder.

4. The apparatus of claim 1 wherein said detector means includes a metal cylinder carrying said photodiode and mounted to the side of said sample, the active area of said photodiode being above said sample to detect emitted luminescence of said sample.

5. The apparatus of claim 1 further comprising means for directing said beam in a raster across said sample, said display means being responsive to said raster directing means for generating said display representative of the scanning of said sample by said beam.

6. In a scanning electron microscope including means for generating an electron beam, means for directing said beam to scan a sample in a predetermined pattern; a housing for said beam generating means and said sample; apparatus comprising detector means including a semiconductor photodiode for sensing optical luminescence transmitted through said sample in response to the impingement thereon by said beam and for converting said sensed, transmitted luminescence to a representative electrical signal; means for mounting said detector means in said vacuum housing immediately beneath said sample whereby said transmitted luminescence is sensed directly on an active area of said photodiode; conductor means coupled to said detector means for coupling said electrical signal through said vacuum housing; and display means coupled to said conductor for generating a visual image responsive to said electrical signal.

7. The apparatus of claim 6 wherein said microscope includes a specimen stage for supporting said sample, said detector means comprising a metal casing for holding said photodiode immediately beneath said sample; said detection means further comprising a low noise feedback amplifier in circuit with said photodiode and mounted in said metal casing within said vacuum housing.

* * * * *

UNITED STATES PATENT OFFICE
CERTIFICATE OF CORRECTION

Patent No. 4,117,323  Dated September 26, 1978

Inventor(s) Raymond Thomas Greer; Bradley Harold Vale; and David Michael Martin.

It is certified that error appears in the above-identified patent and that said Letters Patent are hereby corrected as shown below:

Column 2, line 2, "system" should be -- signal --.

Signed and Sealed this

Sixth Day of March 1979

[SEAL]

Attest:

RUTH C. MASON
*Attesting Officer*

DONALD W. BANNER
*Commissioner of Patents and Trademarks*